(12) United States Patent
Kalkowski et al.

(10) Patent No.: US 9,815,262 B2
(45) Date of Patent: Nov. 14, 2017

(54) METHOD FOR JOINING SUBSTRATES

(75) Inventors: Gerhard Kalkowski, Jena (DE);
Carolin Rothhardt, Jena (DE);
Mathias Rohde, Bad Klosterlausnitz (DE); Ramona Eberhardt, Bucha (DE)

(73) Assignees: Fraunhofer-Gesellschaft zur Förderung der angewandten Forschung e.V., Munich (DE); Friedrich-Schiller-Universität Jena, Jena (DE)

( * ) Notice: Subject to any disclaimer, the term of this patent is extended or adjusted under 35 U.S.C. 154(b) by 801 days.

(21) Appl. No.: 14/000,745

(22) PCT Filed: Feb. 21, 2012

(86) PCT No.: PCT/EP2012/052929
§ 371 (c)(1),
(2), (4) Date: Dec. 2, 2013

(87) PCT Pub. No.: WO2012/113787
PCT Pub. Date: Aug. 30, 2012

(65) Prior Publication Data
US 2014/0083597 A1 Mar. 27, 2014

(30) Foreign Application Priority Data
Feb. 22, 2011 (DE) .......................... 10 2011 012 835

(51) Int. Cl.
*B32B 37/14* (2006.01)
*B23K 20/24* (2006.01)
(Continued)

(52) U.S. Cl.
CPC ............. *B32B 37/14* (2013.01); *B23K 20/02* (2013.01); *B23K 20/24* (2013.01); *C03B 23/20* (2013.01); *C03C 27/06* (2013.01); *C04B 35/645* (2013.01); *C04B 37/005* (2013.01); *C04B 37/006* (2013.01); *H01L 21/2007* (2013.01); *C04B 2235/6581* (2013.01); *C04B 2235/963* (2013.01); *C04B 2237/06* (2013.01); *C04B 2237/12* (2013.01); *C04B 2237/34* (2013.01); *C04B 2237/343* (2013.01); *C04B 2237/345* (2013.01); *C04B 2237/36* (2013.01); *C04B 2237/365* (2013.01); *C04B 2237/52* (2013.01); *C04B 2237/56* (2013.01); *C04B 2237/704* (2013.01)

(58) Field of Classification Search
None
See application file for complete search history.

(56) References Cited

U.S. PATENT DOCUMENTS

2009/0294017 A1 12/2009 Traggis et al.
2010/0288422 A1* 11/2010 Krauss .................... C03C 27/06
                                                    156/105
2012/0013012 A1 1/2012 Sadaka et al.

OTHER PUBLICATIONS

"European Application Serial No. 12706523.3, Office Action dated Apr. 13, 2016", (w/ English Translation), 9 pgs.
(Continued)

*Primary Examiner* — Christopher Schatz
(74) *Attorney, Agent, or Firm* — Schwegman Lundberg & Woessner, P.A.

(57) ABSTRACT

The invention relates to a method of joining substrates. It is the object of the invention in this respect to join substrates of substrate materials together without having to exert an increased effort for a coating with additional coating processes to be carried out and to be able to achieve a good quality of the join connection in so doing. In the method in accordance with the invention a pretreatment of at least one join surface of a substrate to be joined is carried out in low pressure oxygen plasma prior to the actual joining. On the joining, a contact force acts on the substrates to be joined in the range 2 kPa to 5 MPa and in this process a heat treatment is carried out at an elevated temperature of at least 100° C. and at under pressure conditions of a maximum of 10 mbar, preferably $<10^{-3}$ mbar.

20 Claims, 1 Drawing Sheet

Figure 1:
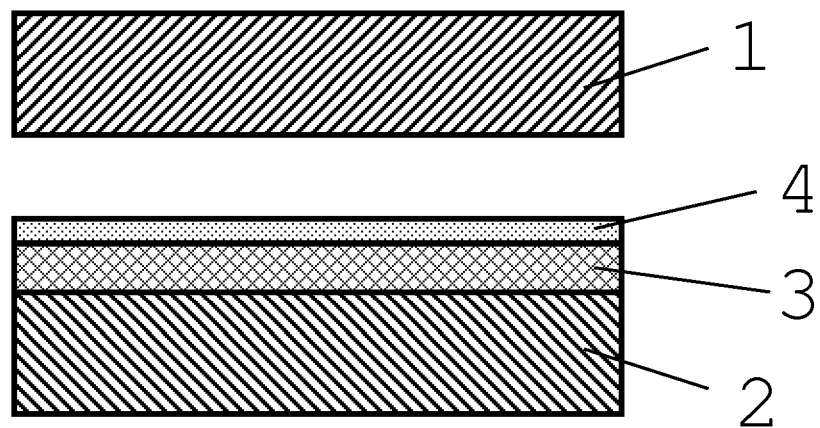

(51) Int. Cl.
*C03B 23/20* (2006.01)
*C03C 27/06* (2006.01)
*C04B 35/645* (2006.01)
*C04B 37/00* (2006.01)
*H01L 21/20* (2006.01)
*B23K 20/02* (2006.01)

(56) References Cited

OTHER PUBLICATIONS

"International Application No. PCT/EP2012/052929, English Translation of International Preliminary Report on Patentability dated Sep. 6, 2013", (Sep. 6, 2013), 10 pgs.
"International Application No. PCT/EP2012/052929, International Search Report and Written Opinion dated May 22, 2012", (May 22, 2012), 16 pgs.
Dragoi, V., et al., "Wafer-level plasma activated bonding: new technology for MEMS fabrication", Microcryst. Tech., vol. 14, (2008), 509-515.
Kalkowski, G., et al., "Optical contacting of low-expansion materials", Proc. SPIE 8126, Optical Manufacturing and Testing IX, (Aug. 22, 2011), 81261F-1-81261F-7.
Li, Y. A., et al., "Systematic low-temperature silicon bonding using pressure and temperature", Japanese Journal of Applied Physics, vol. 37, (1998), 737-741.
Suni, T., et al., "Effects of plasma activation on hydrophilic bonding of Si and SiO2", Journal of the Electrochemical Society, vol. 149, No. 6, (2002), G348-G351.

\* cited by examiner

METHOD FOR JOINING SUBSTRATES

PRIORITY CLAIM TO RELATED APPLICATIONS

This application is a national stage application under 35 U.S.C. §371 of PCT/EP2012/052929, filed Feb. 21, 2012, and published as WO 2012/113787 A1 on Aug. 30, 2012, which claims priority to German Application No. 10 2011 012 835.2, filed Feb. 22, 2011, which applications and publication are incorporated by reference as if reproduced herein and made a part hereof in their entirety, and the benefit of priority of each of which is claimed herein.

The invention relates to a method of joining substrates. In particular optically transparent substrates can thus be connected to one another.

The substances and materials named in the following can be used as the substrate materials:

1) Glass materials which predominantly contain $SiO_2$ (e.g. pure $SiO_2$ (fused silica), BK7, Pyrex 7740 or ULE of Corning/USA), glass ceramics (e.g. ZERODUR from Schott/Germany);
2) Crystalline materials having a high oxide portion (e.g. vanadates such as yttrium vanadate, garnets such as yttrium aluminum garnet, each also doped with any desired rare earths for laser applications, also $KTiOPO_4$, $LiB_3O_5$ or $LiNbO_3$);
3) Materials which predominantly include aluminum oxide (e.g. sapphire, also doped with other elements);
4) Very stiff, sintered mechanical materials such as SiC and Si-infiltrated SiC (SiSiC);
5) Semiconductors/Infrared optical materials such as ZnSe, Si, Ge, GaAs, etc.

On the use of high-quality surfaces having the properties described more exactly below
a) very smooth
b) very low roughness,
very solid glass parts (e.g. ceramic materials, laser-active materials, non-linear optical materials, . . . ) can also be joined free of intermediate layers using the method described below.

This has already become known in a similar form—in part under the term "optical contacting", see e.g.: US 2009/0294017 A1 Taggis.

It is the object of the invention to join substrates of substrate materials together without having to exert an increased effort for a coating with additional coating processes to be carried out and to be able to achieve a good quality of the join connection in so doing.

In accordance with the invention, this object is achieved by a method having the features of claim 1. Advantageous embodiments of the invention can be realized using features designated in subordinate claims.

It cannot be seen from the previously known processes that considerable quality improvements can be achieved with an increased contact pressure in the joining process, in particular during the holding at the elevated temperature, and that a direct joining is only possible thereby with many substrate materials.

It is not known from the prior art that the strength of the join connection is improved with a suitable pretreatment of the substrates in a low pressure oxidizing plasma or that the additional application of dielectric intermediate layers can be omitted which are only applied for the subsequent achievement of a firm connection using the method of direct joining. For example, in accordance with US 2009/0294017 A1, for ZnSe first a thin $SiO_2$ coating or $Al_2O_3$ coating should additionally be applied using a coating process in order to be able to join it directly. Other oxide coatings ($TiO_2$, $Ta_2O_5$, $Nb_2O_5$) are also mentioned there.

The microscopic contact in the join region (the mutual microscopic penetration of the surfaces into one another) is in particular improved by the pressing on and the strength of the join connection can thereby be increased, and the transmission through the join layer can be improved in transmitting optical applications.

The following method steps are required with solid substrates in accordance with the method in accordance with the invention:

pretreating the join surfaces in a low pressure oxygen plasma as described in more detail below; using contact forces which are as high as possible of at least 2 kPa, preferably at least 20 kPA to approx. 5 MPa, in the joining process, in particular during the heat treatment at elevated temperature;

carrying out the joining process at vacuum conditions of max. 10 mbar, preferably $<10^{-3}$ mbar.

In particular connections of materials are possible under such conditions which can otherwise not be joined directly (or only with the substantially higher effort of applying an additional intermediate oxide layer).

This e.g. relates to ZnSe and SiC, that is to materials without a natural oxide layer at the surface, but which can be formed to a sufficient extent in the invention by a treatment in the oxygen plasma.

The oxygen plasma can also be used with substrates previously coated in a metallic manner (e.g. Ti) or a semiconducting manner (e.g. Si) or in a dielectric manner (e.g. $Si_3N_4$ or $CaF_2$) in order to improve the joining capability by the corresponding oxidization of the coating or to provide the requirement for a joining at all.

The existing surface is first largely oxidized by an intensive oxygen pretreatment with low pressure plasma (pressure 0.01 bar-100 mbar, preferably approx. 0.3 mbar) and any carbon present there, for example, is likewise oxidized and can be removed in gaseous form as CO or as $CO_2$. The oxygen plasma treatment should only be carried out after a thorough precleaning of the components has already taken place—as described in more detail below.

The oxygen plasma treatment should be carried out at a power density of at least 0.5 watts/cm$^2$ and a maximum of 10 W/cm$^2$ (preferably approx. 5 Watts/cm$^2$) in oxygen throughflow operation, with a supply of oxygen at at least 1 standard cm$^3$/min (preferably at least 10 standard cm$^3$/min) and over a period of at least 1 min (preferably at least 10 min).

Instead of the throughflow operation, a multiple, successive treatment in $O_2$ plasma can also be carried out with a subsequent respectively short rinsing (approx. 2 min) under deionized/distilled water with megasonic assistance on a rotary table (approx. 300 revolutions/min-2000 revolutions/min) and subsequent spin drying.

The direct join surface is oxidized by the described pretreatment in a very thin film (which is only a few nm thick) or is still occupied by water molecules before the next plasma treatment, whereby particularly good conditions for the oxidation are present.

The use of the contact force takes place by suitable plungers or weights which press the substrates placed on one another firmly toward one another.

In this respect, elastic/yielding mats of PFTE or expanded graphite should be placed between the substrates and the plungers to protect the surfaces from damage and to distribute the pressure as uniformly as possible (without exerting bending stress).

Planarity Demands on Joining Surfaces for "Direct Joining"

The planarity on the polishing joining surfaces can best be determined interferometrically. The peak-to-valley value (PV) corresponds to the distance between the highest and lowest points when the surface is approximated by a compensation plane.

Limit values for planar, smooth substrates:
Planarity better than 1 μm PV (peak-to-valley) over 100 mm diameter for solid substrates, e.g. of glass having a thickness >5 mm
Planarity better than 10 μm PV (peak-to-valley) over 100 mm diameter for thinner substrates, e.g. of glass having a 1 mm<thickness<5 mm
Planarity better than 40 μm PV (peak-to-valley) over 100 mm diameter for thin substrates, e.g. of glass having a thickness<1 mm The planarity should preferably, however, be better than these limit values by at least a factor of 10.

With substrates which are larger, this should apply over every selected area section having a diameter of 100 mm With substrates which are smaller, it should be scaled proportionally to the diameter.

Example: Blank with 25 mm diameter, 10 mm thick Limit value→1 μm*25 mm/100 mm=250 nm Preferred value→250 nm/10=25 nm.

With spherical join surfaces, this state of affairs should be transferred accordingly so that the maximum gap on contact of the join surfaces does not become larger than the corresponding values of a planar substrate of the same extent and wall thickness.

Roughness Demands on Joining Surfaces for "Direct Joining/Bonding"

(The roughness can best be determined using an AFM (atomic force microscope). The root mean square (RMS) designates the mean square roughness value (the root from the mean of the squared height deviations with respect to a compensation plane over an area of typically 1 μm×1 μm, occasionally also 10 μm*10 μm).

Limit Values:
Roughness better than 3 nm RMS (root mean square)

The RMS roughness should, however, preferably be better than this limit value by at least a factor of 5.

Cleaning and Plasma Activation Prior to Joining/Bonding

The substrates to be joined must have a high cleanliness in addition to the described geometrical requirements (very high planarity and coincidence of shape and extremely low roughness).

They should generally first run through a good precleaning which reliably removes greases, dirt, polish residues, salts, etc. on the join surfaces. The join surfaces should then no longer be exposed to any contact.

After the precleaning, the pretreatment of the surfaces in oxygen plasma takes place as described above—for achieving suitably oxidized surfaces for the direct joining. This condition is frequently not yet sufficient for direct joining/bonding since the surfaces themselves are contaminated again very fast (invisibly) even with a brief storage in a protected environment by very small aerosols/particles, organic vapors from the environmental air (e.g. solvents or degasing plastic packages, etc.). Even monolayers of hydrocarbons can be harmful.

A further fine cleaning and activation of the join surfaces should therefore be carried out directly (a maximum of 3 h, better less than 1 h) before the joining process in a clean room environment of high quality (ISO 4 or better).

For this purpose, an aqueous, chemically assisted cleaning of the join surfaces is first carried out based on the known RCA process for Si wafers in the semiconductor industry.

(Alkaline) $NH_4OH$ solutions (ammonia, approx. 1% by mass-4% by mass in deionized water) are used in alternation with $H_2O_2$ solutions (hydrogen peroxide approx. 1% by mass-4% by mass in deionized water).

These solutions are preferably alternately (approx. 2 minutes in each case) rinsed over the join surfaces while the substrates to be cleaned rotate on a rotary table (approx. 300 revolutions/min-2000 revolutions/min) to spin dissolved particles/substances immediately away to the outside by centrifugal force.

A rinsing process then takes place with distilled or at least deionized (DI) water, where possible likewise while rotating and where possible with sound wave assistance in the megahertz range (megasonic cleaning). Finally, the cleaned substrate is spun dry or is blown dry using very pure $N_2$ gas.

The total process can optionally take place several times one after the other and the effect of the chemical solutions on the substrate surfaces can already take place with megasonic assistance. Optionally, the alkaline solution can also be dispensed with to preclude unwanted chemical reactions on the surface.

A brief plasma activation of the join surfaces can be carried out again immediately after the fine cleaning in the oxygen plasma or nitrogen plasma at pressures between approx. 0.01 mbar and 100 mbar (preferably approx. 0.3 mbar for approx. 30 s to 1 min) and a rinsing process can be carried out using distilled or deionized water with subsequent spin drying. Hydrophilic surfaces are thereby achieved which are saturated with OH groups and are particularly well suited for the subsequent direct joining/bonding. The join surfaces activated in this manner should be placed on one another directly subsequently and are connected to one another in vacuum at pressure and at an elevated temperature.

The handling of the substrates (from cleaning and plasma activation up to the placing on one another) should take place such that the join surfaces are not touched or otherwise contaminated in the meantime.

Joining Process

The joining process should be carried out directly subsequent to the above process steps (cleaning, plasma activation, rinsing) to avoid a renewed contamination of the join surfaces with solid particles or gaseous pollutants from the environment.

For joining, the dried parts are brought into tight mechanical contact by suitable pressing in the region of the join surfaces. This should preferably take place in vacuum at a pressure of <10 mbar, preferably <$10^{-3}$ mbar.

In the pressed state, the composite is heated uniformly (approx. 5-10° C./min) and held at a maximum temperature in the range from around 100° C. to 600° C., preferably at approximately 250° C., for a specific time. The duration of the heat treatment can be reduced as the holding temperature increases. It should amount to around ½ hour to 24 hours, preferably around 4 hours, for a holding temperature of 250° C.

The contact pressure can be lower in the phase of heating up than on the holding at an elevated temperature to avoid stresses and breakage due to strains, in particular due to thermal expansion differences between plungers and substrates.

The pressing force at the elevated temperature should lie in the range between 2 kPa and around 5 MPa, preferably, however, 2 MPa, in the join of glass substrates to keep the risk of strains/warps in the substrates, or even of damage, as small as possible.

It should be sufficiently high to bring the substrates to be joined into close mechanical contact over their total join surface. This requires a relatively low pressure with perfectly planar surfaces. With thin plates (wafers), the planarity is usually restricted by elasticity/flexibility of the parts since the surface processing admittedly first produces a planar state—e.g. during lapping/polishing—but then bends can begin to appear again due to inner stresses/material inhomogeneities. The result is frequently a wavy surface (called bow and warp in Si semiconductor wafers) which can, however, cling to a planar counter-surface at sufficient contact pressure.

A bending load on the solid substrates which exceeds the (particularly critical) tensile strength of the material is to be avoided at all costs. It is sensible for this purpose to compensate irregularities/shape deviations by yielding (soft/elastic) layers between the parts to be joined and the plungers and to exert a uniform (areal) pressure force distribution over the substrates to be joined without high local bending strain occurring.

These layers can e.g. be films of expanded graphite (e.g. flexible graphite film "SIGRAFLEX" from SGL Group, SGL CARBON SE, Rheingaustr. 182, 65203 Wiesbaden, Germany) or films of temperature-resistant plastic (PTFE) which are placed over one another in multiple layers under certain circumstances. The surfaces are hereby also protected against scratches/damage.

After a sufficient heat treatment at an elevated temperature, the contact pressure should be cancelled (or at least greatly reduced) and the temperature then again slowly lowered (approx. 5° C./min) to room temperature.

When joining materials whose thermal expansion is very well matched to each other (less than 10% deviation relative to one another in the range between room temperature and maximum joining temperature), the cooling can also take place substantially faster.

The invention will be further explained by way of example in the following:

There are Shown:

FIG. 1 an example of substrates prior to the joining; and

Figure 2:
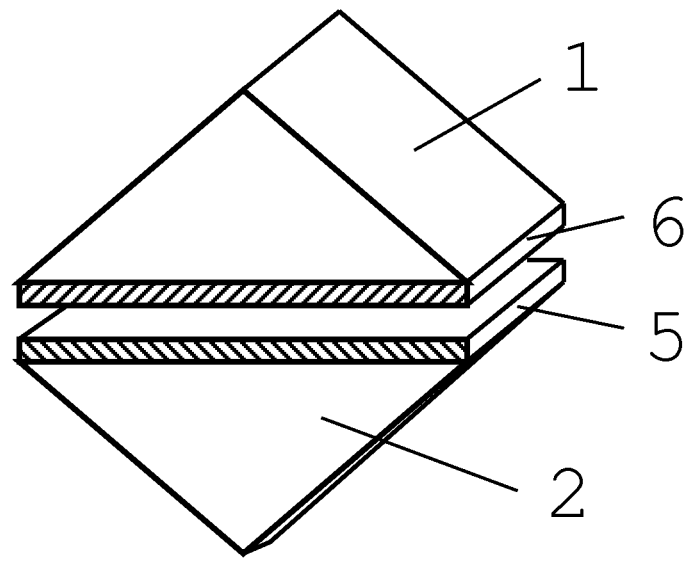

FIG. 2 a further example of substrates prior to the joining.

FIG. 1 shows two substrates prior to the joining (in cross-section, not to scale). The substrates are two solid glass plates 1, 2, wherein the plate 2 is provided with a coating 3 and the coating 3 was superficially oxidized by $O_2$ plasma treatment and hereby has a modified composition with an oxide portion in the layer 4 at the surface. An application is possible as a dichroitic filter, laser reflector, holding element (chuck), mechanical platform, among many others.

The two glass plates 1 and 2 can be made of fused silica, ULE or BK7 glass. A coating 3 of a metal (e.g. nickel, titanium, chromium, silver) or a metal alloy in the form of a thin film having a layer thickness in the range 10 nm to 100 nm is formed on the surface of the glass plate 2.

A metal oxide (NiO, $TiO_2$, $Cr_2O_3$, $Ag_2O$) corresponding to the metal can be formed directly on the surface 4, i.e. exactly at the surface at which it is required for the joining, by an oxygen treatment in low pressure plasma. On joining, a chemical bond with the surface of the glass plate 1 is achieved by the formed oxide.

At least one oxide layer can also be formed instead of the coating 3 of metal. This/these can be layers of $HfO_2$, indium tin oxide (ITO), MgO, $Nb_2O_5$, SiO, $SiO_2$, $TiO_2$, $Ta_2O_5$ or $ZrO_2$. If a plurality of layers are formed, they can form an optical multilayer system in which alternating layers are formed alternately from an oxide with higher and lower indices of refraction. So-called interference filters for optical applications can thus be manufactured in this manner. The layer thicknesses of the individual layers can be coordinated with specific wavelengths while taking account of the respective indices of refraction as $\lambda/4$ layers. $SiO_2$, for instance, has an index of refraction of approx. 1.5 and $TiO_2$ has an index of refraction of approx. 2.4 for wavelengths of electromagnetic radiation around 500 nm, that is in the middle spectral range of visible light.

The forming of layers can be achieved using PVD and CVD processes known per se.

It can be advantageous for optical or mechanical reasons to configure a multilayer system having one or more layers in which the respective oxide is not stoichiometric and is preferably hypostoichiometric. With $TiO_x$ and $SiO_x$ x can thus be <2. An oxygen treatment with low pressure plasma can effect an oxidation to higher valency in which the thermodynamically more stable stoichiometric oxides $TiO_2$ or $SiO_2$ are obtained directly at the surface 4. The joining conditions and the strength of the join can thereby be improved.

Non-stoichiometric oxide layers with an oxygen deficit can result in application-specific optical advantages, e.g. in an increased absorption in the wavelength range of visible light, but good transmission at wavelengths of electromagnetic radiation from the spectral range of IR light. This applies, for example, to $SiO_x$, where $1<x<2$. In addition, the layer properties for the joining can be improved since these layers are more porous and/or their Young's-modulus (E) is smaller than the Young's modulus of the substrate material. Such a layer can be "more adaptable".

If different materials are used for the substrates to be joined together, their thermal coefficients of expansion should be taken into account. With different thermal coefficients of expansion, mechanical stresses can occur in the joining zone during the thermal treatment and the pressing if this is not sufficiently taken into account. A non-permanent connection of substrates could thereby be achieved. For this purpose, however, the dimensioning of the joining surfaces, the Young's modulus, the geometry of the substrates, the bending stiffness and the maximum temperature in the heat treatment also have an influence so that it should be monitored for respective cases.

In trials with circular disks of terbium gallium garnet ($Tb_3Ga_5O_{12}$) which had a diameter of 10 mm with a height/thickness of 2 mm, it was shown that they could be joined without problem to circular disks of sapphire having an outer diameter of 12 mm with a height/thickness of 2 mm at a maximum temperature of 200° C. The thermal coefficient of expansion of therbium gallium garnet (cubic crystal system, expansions the same in all directions) lies at $9*10^{-6}K^{-1}$ and that of sapphire in the plane of the surfaces to be joined together (perpendicular to the optical axis of the substrates connected to one another) at $6*10^{-6}K^{-1}$. It follows on from this that at correspondingly low temperatures which are used for the joining substrates of different materials can also be joined and the connection is permanently firm in so doing.

FIG. 2 likewise shows two substrates prior to the joining (exploded representation, not true to scale). The substrates in this example are two solid glass prisms 1, 2, wherein both prisms 1 and 2 can be provided with different layers 5, 6 (or can also be not coated) and are modified microscopically by a low pressure $O_2$ plasma treatment or also another plasma treatment ($N_2$ plasma, AR plasma, . . . ) on their surfaces. A use as a beam splitter is possible here.

The prism shape selected in this example for the substrates represents a special embodiment which can in particular be tailored to beam splitter cubes. In this respect, optical multilayer systems are frequently applied, such as have already been mentioned above, for example, to facilitate an optical filter effect.

However, other geometries such as circular disks, hemispheres or substrates with concavely or convexly curved surfaces can also be connected to one another instead of the prisms 1 and 2. With substrates of SiC, the joining can be achieved when the surfaces to be connected to one another satisfy the named geometrical surface conditions and a sufficient plasma treatment has been carried out prior to the joining with oxygen as the plasma gas.

The formation of the volatile/gaseous carbon oxides (CO and $CO_2$) as well as of the non-volatile/solid silicon oxides (SiO and $SiO_2$) can be achieved by the reaction of the oxygen plasma with the SiC directly at the surfaces. In throughflow operation or with a multiple treatment with the plasma, the carbon can largely be removed from the surface regions and can be replaced by a thin silicon oxide layer. The hydrophilic joining process can advantageously be carried out using formed silicon oxide layers on the surfaces to be joined.

In an analog form, substrates from other materials such as SiC with silicon or silicon with Pyrex glass (e.g. type 7740 from Corning) can thus be connected to one another by joining.

The invention claimed is:

1. A method of joining substrates comprising:
   applying a pressing force in the range of 2 kPa to 5 MPa on substrates to be joined;
   heat treating the substrates at an elevated temperature of at least 100° C. and under pressure conditions of a maximum of 10 mbar;
   pretreating at least one joining surface of at least a first of the substrates to be joined prior to the applying of the pressure and the heat treating; and
   smoothing at least a portion of the joining surface of the first of the substrates prior to the applying of the pressure and the heat treating such that, after the smoothing, at least the portion of the joining surface has a planarity or a deviation with a specified peak to valley value,
   wherein the specified peak to valley value is less than 1 µm per 100 mm of diameter of the portion of the joining surface if a thickness of the first of the substrates is greater than 5 mm, and wherein the specified peak to valley value is less than 10 µm per 100 mm of diameter of the portion of the joining surface if the thickness of the first of the substrates is less than 5 mm, and wherein the pressing force and the heat treating joins the substrates.

2. The method in accordance with claim 1, wherein the substrates comprise a glass that is predominantly at least one of $SiO_2$, a glass ceramic, a crystalline material with a high oxide portion, aluminum oxide, SiC, SiSiC, ZnSe, Si, Ge, and GaAs.

3. The method in accordance with claim 1, further comprising:
   cleaning the joining surface by alternate rinsing with aqueous $NH_4OH$ solution and $H_2O_2$ solution, each of the $NH_4OH$ solution and the $H_2O_2$ solution having a respective concentration in the range of 2 mass % to 4 mass %, subsequent to the cleaning, rinsing the joining surface in distilled or deionized water while simultaneously exposing the substrates to be joined to sound waves in the megahertz range, and
   subsequent to the rinsing, drying the substrates.

4. The method in accordance with claim 1, wherein the pretreating comprises applying a low pressure oxygen plasma to at least the portion of the joining surface.

5. The method in accordance with claim 4, wherein the low pressure oxygen plasma has a power density in the range 0.5 $W/cm^2$ to 10 $W/cm^2$.

6. The method in accordance with claim 4, further comprising, subsequent to the applying of the low pressure oxygen plasma, rinsing the joining surface in distilled or deionized water while simultaneously exposing the substrates to sound waves in the megahertz range and
   subsequent to the rinsing, drying the joining surface.

7. The method in accordance with claim 1, further comprising forming a surface layer of a metal, a semiconductor, or a dielectric material on at least the portion of the joining surface prior to the applying of the pressure and the heat treating.

8. The method in accordance with claim 7, further comprising forming an alternating multilayer system having individual layers of materials having a different index of refraction.

9. The method in accordance with claim 7, further comprising forming at least one layer of a non-stoichiometric oxide on at least one of the substrates.

10. The method in accordance with claim 1, wherein the heat treating is carried out under pressure conditions less than $10^{-3}$ mbar.

11. The method in accordance with claim 2, wherein the glass comprises at least one of yttrium vanadate, yttrium aluminum garnet, and sapphire.

12. The method in accordance with claim 1, wherein, after the smoothing, the specified peak to valley value is better than 40 µm per 100 mm of diameter of the portion of the joining surface if the thickness of the first of the substrates is less than 1 mm.

13. The method in accordance with claim 1, wherein, after the smoothing, at least the portion of the joining surface has a surface roughness of less than 3 nm root mean square.

14. The method in accordance with claim 1, wherein, after the smoothing, at least the portion of the joining surface has a surface roughness of less than 1 nm root mean square.

15. A method of joining substrates comprising:
   providing or receiving a plurality of substrates to be joined, the substrates comprising a glass comprising at least one of $SiO_2$, a glass ceramic, a crystalline material with a high oxide portion, an aluminum oxide, SiC, SiSiC, ZnSe, Si, Ge, and GaAs;
   smoothing at least a portion of a joining surface of a first of the plurality of the substrates such that, after the smoothing, at least the portion of the joining surface has a surface roughness less than 1 nm root mean square, and, after the smoothing, at least the portion of the joining surface has a planarity or a deviation with a specified peak to valley value,
   wherein the specified peak to valley value is less than 1 µm per 100 mm of diameter of the portion of the joining surface if a thickness of the first of the plurality of the substrates is greater than 5 mm, and the specified peak to valley value is less than 10 pm of per 100 mm of diameter of the portion of the joining surface if the thickness of the first of the plurality of the substrates is less than 5 mm; forming a surface layer of metal, a semiconductor, or a dielectric material on at least the portion of the joining surface; cleaning the joining surface by alternate rinsing with aqueous $NH_4OH$ solution and $H_2O_2$ solution, each of the $NH_4OH$ solution and the $H_2O_2$ solution having a respective concentration in the range of 2 mass % to 4 mass % subsequent to the cleaning, rinsing the joining surface with distilled or deionized water while simultaneously exposing the plurality of the substrates to sound waves in the megahertz range;

subsequent to the rinsing, drying the joining surface;

subsequent to the drying, plasma-treating at least the portion of the joining surface with low pressure oxygen plasma having a power density in the range 0.5 $W/cm^2$ to 10 $W/cm^2$;

subsequent to the plasma-treating, applying a pressing force in the range of 2 kPa to 5 MPa on the plurality of the substrates; and heat treating the plurality of the substrates at an elevated temperature of at least 100° C. and under pressure conditions of less than $10^{-3}$ mbar while applying the pressing force on the plurality of the substrates, wherein the pressing force and the heat treating joining the plurality of substrates.

16. The method in accordance with claim 4, wherein the low pressure oxygen plasma is applied over a time period of at least 60 seconds.

17. The method in accordance with claim 16, wherein the applying of the low pressure oxygen plasma comprises multiple successive plasma action over the time period.

18. The method in accordance with claim 16, wherein the applying of the low pressure oxygen plasma comprises a continuous process over the time period.

19. The method in accordance with claim 2, wherein the crystalline material with the high oxide portion comprises at least one of a vanadate, a garnet, $KTiOPO_4$, $LiB_3O_5$, or $LiNbO_3$.

20. The method in accordance with claim 15, wherein the crystalline material with the high oxide portion comprises at least one of a vanadate, a garnet, $KTiOPO_4$, $LiB_3O_5$, or $LiNbO_3$.

* * * * *